United States Patent [19]

Skoda et al.

[11] 4,287,447
[45] Sep. 1, 1981

[54] CRYSTAL HOLDER FOR DIFFERENT SIZES OF CRYSTAL

[75] Inventors: William G. Skoda, Oak Park; Marlin Luff, Glendale Heights, both of Ill.

[73] Assignee: Motorola, Inc., Schaumburg, Ill.

[21] Appl. No.: 112,880

[22] Filed: Jan. 17, 1980

[51] Int. Cl.³ .............................................. H01L 41/08
[52] U.S. Cl. ..................................... 310/348; 310/353
[58] Field of Search ................................. 310/340–356

[56] References Cited

U.S. PATENT DOCUMENTS

| | | | |
|---|---|---|---|
| 1,933,601 | 11/1933 | Scheibell | 310/349 |
| 2,409,607 | 10/1946 | Bach | 310/348 |
| 2,409,838 | 10/1946 | Cress | 310/348 |
| 2,412,438 | 12/1946 | Bach | 310/349 |
| 3,980,911 | 9/1976 | English | 310/353 X |
| 4,079,284 | 3/1978 | Fanshawe | 310/348 |

Primary Examiner—Mark O. Budd
Attorney, Agent, or Firm—Mark P. Kahler; Edward M. Roney; James Gillman

[57] ABSTRACT

A crystal holder is provided which is capable of supporting any one of a plurality of piezoelectric crystals having different preselected diameters. The crystal holder includes two side portions, each portion having a stair step-like structure, the stair steps of one side portion leading upwardly and away from the stair steps of the remaining side portion. Each step of one side portion is respectively horizontally aligned with a corresponding step of the remaining side portion such that each step pair thus formed has a different distance therebetween and is thus capable of accepting for mounting one of a plurality of piezoelectric crystals having preselected diameters corresponding to the distances between the steps of the step pairs.

7 Claims, 10 Drawing Figures

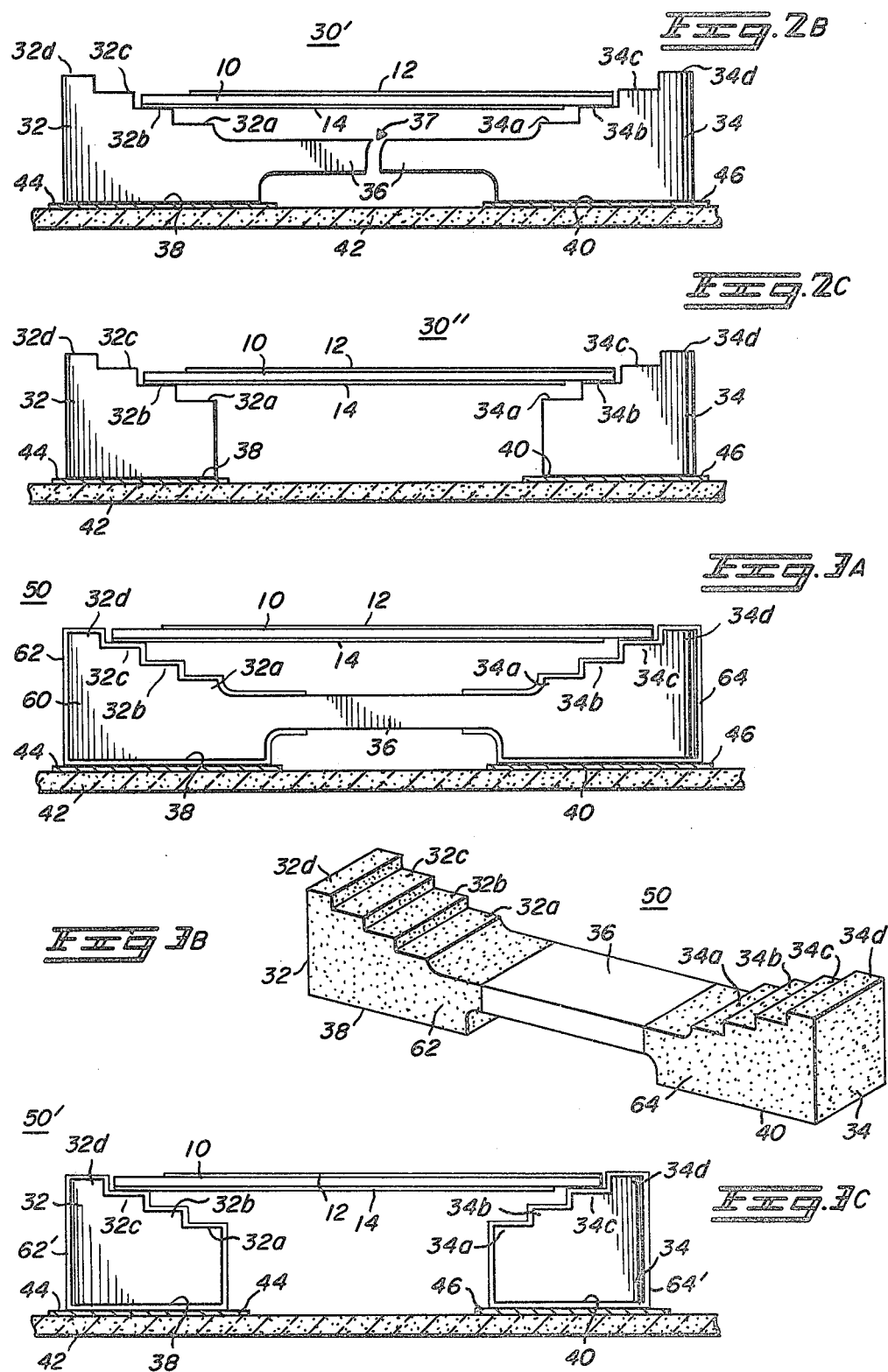

CRYSTAL HOLDER FOR DIFFERENT SIZES OF CRYSTAL

BACKGROUND OF THE INVENTION

This invention relates to crystal holders, and more particularly to piezoelectric crystal holders capable of accommodating crystals having different diameters and thicknesses.

DESCRIPTION OF THE PRIOR ART

To provide support to piezoelectric crystals and to achieve electrical connection of the same to printed circuit boards or other substrates, spring tempered holder clamps are conventionally employed. One such spring tempered clamp is the V spring clamp (See FIG. 1B) which comprises a pair of thin metallic prong-like brackets, each including a V-shaped structure at the top of the bracket. Appropriate portions of the periphery of the relatively fragile quartz crystal are engaged between the apexes of the two V-shaped structures to provide support to the crystal and to achieve electrical connection thereto. Other types of spring tempered clamps which employ two brackets to support the crystal are the F-shaped holder (See FIG. 1C) and the coil spring holder (see FIG. 1D). Prior to placement of the crystal in such mounting clamps, the two brackets comprising the clamp are typically situated on respective metallic pads provided at selected locations on the substrate. The brackets are conveniently soldered to the metallic pads to achieve electrical and mechanical connection thereto. Due to the generally fragile nature of these brackets, placement of the brackets on the substrate is a procedure typically performed manually and not easily subject to automation. Not only are these brackets easily bent and broken, but also the brackets must be relatively precisely positioned, typically by hand, before a crystal is mounted therebetween.

The above-mentioned crystal holders are capable of holding crystals having one preselected diameter per holder. The U.S. Pat. No. 2,409,607, issued on Oct. 22, 1946, to H. M. Bach for a Multiple Crystal holder shows one crystal holder capable of accommodating a crystal having either one of two preselected sizes. The Bach crystal holder includes a main cavity having a generally irregular polygon shape as illustrated in his FIG. 5. The sides of the cavity define internally a plurality of rectangular boundaries of different peripheral sizes. Each rectangular boundary is capable of accepting a crystal having the preselected size and shape commensurate thereto. All of the rectangular crystal holding chambers shown in the Bach patent are positioned in the same horizontal plane. A spring structure is relied on to hold the crystal in the selected rectangular chamber. Such a crystal holder, although capable of accommodating various size crystals, would be difficult to mount on a printed circuit board or other substrate in an automated manner. Spring structures are by nature inherently difficult to automatically feed. Additionally, external contacts on the holder do not have a common surface to allow direct contact to be made between the contacts and a substrate.

It is one object of the present invention to provide a crystal holder capable of accepting crystals having various sizes and configurations.

Another object of the invention is to provide a crystal holder which is easily positioned and mounted on a hybrid circuit substrate, a printed circuit board or other substrate by automated machinery.

These and other objects of the invention will become apparent to those skilled in the art upon consideration of the following description of the invention.

BRIEF SUMMARY OF THE INVENTION

The present invention is directed to providing a crystal holder, the positioning and mounting of which on a selected substrate is easily subject to automation, and which accommodates crystals of various sizes.

In accordance with one embodiment of the invention, a crystal holder includes first and second opposed side portions of selected material. Each of these side portions includes electrically conductive top and bottom surfaces and at least sufficient electrically conductive external surfaces to provide electrically conductive paths from the respective top surfaces thereof to the respective bottom surfaces thereof. The electrically conductive paths of the first side portion are electrically insulated from the electrically conductive paths of the second side portion. The first side portion includes a plurality of steps in the top surface thereof leading upwardly and away from the second side portion in stair step-like fashion. Each step includes a horizontal portion and a vertical portion, the horizontal portion of each step being situated at a different selected height above the bottom surface of the first side portion. The second side portion includes a plurality of steps in the top surface thereof, each step having a horizontal portion and a vertical portion. The steps of the second side portion lead in stair step-like fashion upwardly and away from the first side portion of the crystal holder and in a direction opposite that to which the steps of the first side portion lead as viewed from above the first and second side portions. The horizontal portion of each step of the second side portion is horizontally aligned with a corresponding horizontal portion of a step of the first side portion. Each step of the first side portion and the corresponding horizontally aligned step of the second side portion have a horizontal distance therebetween sufficient to accommodate a crystal of predetermined horizontal dimension between the respective vertical portions of such corresponding steps.

The features of the invention believed to be novel are set forth with particularity in the appended claims. The invention itself, however, both as to organization and method of operation, together with further objects and advantages thereof, may best be understood by reference to the following description taken in conjunction with the accompanying drawings.

DESCRIPTION OF THE DRAWINGS

FIG. 2B is a side view of the completed crystal holder of FIG. 2A showing a crystal of selected diameter mounted therein and illustrating placement of the crystal holder on a substrate.

FIG. 2C is a side view of the crystal holder of FIG. 2B shown without the center connecting portion.

FIG. 3A is a side view of a preferred crystal holder comprised substantially of an electrically insulative material shown with a crystal mounted therein, the holder being situated on a substrate.

FIG. 3B is a perspective view of the crystal holder of FIG. 3A.

FIG. 3C is a side view of the crystal holder of FIG. 3A shown without the center connecting portion.

DETAILED DESCRIPTION OF THE PREFERRED EMBODIMENT

Figure 1A:
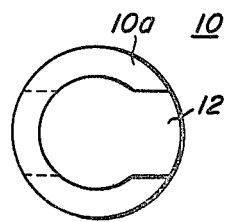
FIG. 1A shows a typical crystal to be mounted in a crystal holder.

FIG. 1A illustrates a typical crystal 10 for which mounting in a crystal holder or bracket is desired. Crystal 10 is substantially circular and includes opposed major surfaces 10a and 10b. Electrically conductive electrodes 12 and 14 (shown more clearly in FIG. 1B) are situated on major surfaces 10a and 10b, respectively, to facilitate connection of crystal 10 to external electrical circuitry.

Figure 1B:
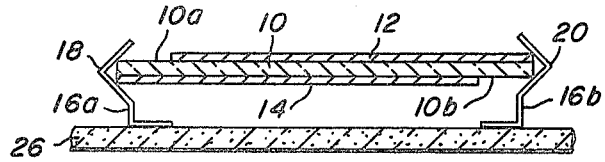
FIG. 1B shows the crystal of FIG. 1A mounted in one type of conventional spring tempered crystal holder which is attached to a selected substrate.

FIG. 1B shows one type of conventional spring tempered crystal holder as holder 16 comprised of thin metallic brackets 16a and 16b. Brackets 16a and 16b each include a straight vertical portion having opposed ends. V-shaped grooves 18 and 20 are situated at one end of brackets 16a and 16b, respectively, in the manner shown in FIG. 1B so as to accept crystal 10 therebetween. The remaining ends of brackets 16a and 16b are typically bent at right angles to facilitate attachment of brackets 16a and 16b to a substrate 26. Prior to placement of crystal 10 between brackets 16a and 16b, brackets 16a and 16b are attached to respective mounting pads (not shown) situated on substrate 26. Once brackets 16a and 16b are so situated, these brackets are typically aligned by hand to have the precise distance therebetween necessary to accommodate crystal 10.

Figure 1C:
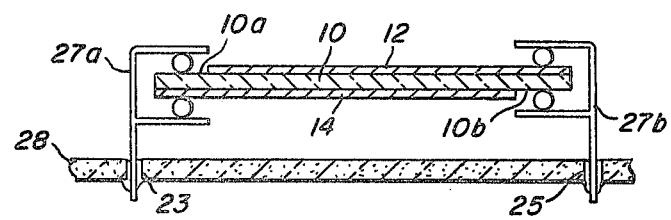
FIG. 1C shows another type of conventional spring tempered crystal holder.

FIG. 1C shows another type of conventional spring tempered crystal mounting fixture as holder 27. Holder 27 comprises two brackets, 27a and 27b, each having an F-shaped structure for accepting an edge of crystal 10 between the horizontal arms of the F. The vertical portions of F-shaped brackets 27a and 27b are conveniently situated in respective holes 23 and 25 in a substrate 28 or otherwise attached to substrate 28. After such mounting, manual adjustment of the distance between brackets 27a and 28b by bending the brackets is often required to assure proper crystal placement.

Figure 1D:
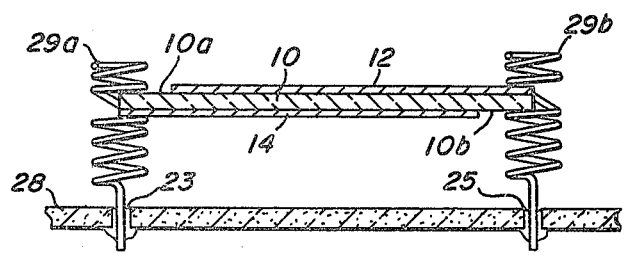
FIG. 1D shows yet another type of conventional spring tempered crystal holder.

FIG. 1D shows another conventional spring tempered crystal holder as holder 29 which includes two coil springlike brackets 29a and 29b. An edge of crystal 10 is positioned between adjacent loops of each of brackets 29a and 29b to support crystal 10. The distance between brackets 29a and 29b is typically manually adjusted by bending the brackets sufficiently to accommodate a crystal of selected size therebetween.

Figure 2A:
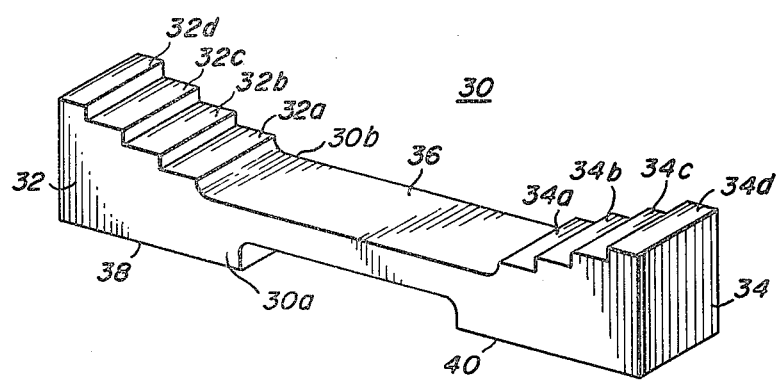
FIG. 2A is a perspective view of the crystal holder of the present invention comprised substantially of an electrically conductive material and shown at a stage near completion.

FIG. 2A shows a side view of the embodiment of the crystal holder of the present invention in a nearly completed stage as holder 30. Crystal holder 30 includes crystal support structures 32 and 34 joined together by a central connecting element 36. Holder 30 is comprised of an electrically conductive material such as a metal, for example, brass, copper, aluminum and the like. Support structures 32 and 34 are illustrated having a somewhat winglike appearance. Other geometrical configurations may be used for structures 32 and 34 providing that such configurations possess sufficient structural integrity to adequately support a crystal and providing the following structural criteria are met. Support structures 32 and 34 each include a plurality of steps resembling stair steps. More specifically, support structure 32 includes steps 32a, 32b, 32c and 32d situated on the top surface thereof and being positioned ascending upwardly and away from central connecting element 36. Support structure 34 includes steps 34a, 34b, 34c and 34d situated in stair step-like fashion on the top surface of structure 34 ascending upwardly and away from central connecting element 36. Steps 34a–34d lead in a direction substantially opposite to that in which steps 32a–32d of structure 32 lead. Each of steps 32a–32d and steps 34a–34d include a substantially vertical portion and a substantially horizontal portion. The horizontal portions of steps 32a–32d are respectively horizontally aligned with the horizontal portions of steps 34a–34d. Thus, a plurality of step pairs are formed, the horizontal portion of each step of a step pair having the same vertical height above central connecting element 36. For example, steps 32a and 34a, steps 32b and 34b, and so forth, form such step pairs. The distance between the vertical portions of the corresponding steps forming the respective step pairs is selected to be sufficient to accommodate a crystal of selected diameter therebetween. For example, assume it is desired that crystal holder 30 accommodate crystals of three different sizes, that is, a Type 1 crystal having a 0.250 inch diameter, a Type 2 crystal having a 0.300 inch diameter and a Type 3 crystal having a 0.350 inch diameter. To facilitate easy mounting of such crystals between the corresponding steps of the step pairs, the distance between the vertical portions of these corresponding steps is conveniently slightly larger than the diameter of the respective crystal selected to be mounted between such corresponding steps. (It is understood that although the crystal holder 30 is capable of holding crystals of various sizes, only one crystal is in fact mounted in each holder.) to accommodate the Type 1 crystal, the distance between the vertical portions of step pair 32b–34b is conveniently 0.260 inches. In a like manner, to accommodate the Type 2 crystal between the vertical portions of the 32c–34c step pair, the distance therebetween is conveniently 0.310 inches. And similarly, to accommodate the Type 3 crystal, the distance between the vertical portions of the 32d–34d step pair is conveniently 0.360 inches. The distance between the vertical portions of the 32a–34a step pair is conveniently 0.210 inches. It is generally not advisable to mount a crystal between the vertical portions of step pair 32a and 34a in this particular embodiment of the crystal holder because a crystal so mounted would likely come in contact with central connecting element 36 resulting in undesirable dampening of the oscillatory motion of the crystal. It should be understood that the invention is not limited to the dimensions set forth above with respect to distances between the vertical portions of step pairs, but rather the distances between such vertical portions are easily varied to accommodate crystals having virtually any diameter. Further, the invention is not limited to the specific embodiment shown which employs four stair step pairs. Rather, a greater or lesser number of stair step pairs may be employed to accommodate more or fewer crystal sizes as desired.

Support structures 32 and 34 respectively include mounting feet 38 and 40 to facilitate electrical connection of holder 30 to a printed circuit board or other substrate. Mounting feet 38 and 40 are formed by the respective bottom surfaces of support structures 32 and 34.

FIG. 2A shows a perspective view of the crystal holder 30 described above. The width of holder 30, that is, the distance from front surface 30a to back surface 30b as shown in FIG. 2A, is conveniently 0.060 inches. Smaller or larger values for the width of holder 30 may of course be selected providing such values are not so small as to substantially diminish the structural integrity of holder 30 and providing further that such width values are not so large so to inappropriately consume excess surface area on the substrate to which holder 30 is to be mounted.

Crystal holder 30 is conveniently fabricated by using extrusion techniques well known to those skilled in the art. More specifically, a die is formed in the shape of front surface 30a of crystal holder 30 as illustrated in FIG. 2A. The metal which is to comprise holder 30 is pressed through the die and is thus formed in the shape of the die. After exiting the die, the metal is cut to the appropriate width described immediately above by conventional sawing techniques to form crystal holder 30. Alternatively, crystal holder 30 is fabricated by forming a mold in the shape of holder 30 as set forth in the drawings and casting holder 30 according to molding techniques well known to those skilled in the art.

FIG. 2B shows a completed holder 30' formed by insertion of an electrically insulative air gap 37 or other electrically insulative structure in connecting element 36 of holder 30 to electrically insulate support structures 32 and 34 from each other. Holder 30' is shown mounted on a selected substrate 42 with crystal 10 being situated on one of the stair step pairs of holder 30'.

Substrate 42 includes mounting pads 44 and 46 which are typically pads of electrically conductive material to which crystal 10 is to be connected as part of some predetermined electrical circuit. Mounting pads 44 and 46 have a sufficient distance therebetween to respectively accept mounting feet 38 and 40 of holder 30 thereon. Generally prior to placement of crystal 10 in holder 30, mounting feet 38 and 40 are respectively soldered or otherwise attached to mounting pads 44 and 46 to achieve electrical connection thereto. To form the above-mentioned air gap 37 in central connecting element 36, element 36 is completely sawed through, or otherwise cut, conveniently after mounting holder 30 on substrate 42. The completed crystal holder structure designated 30' is thus formed. Crystal 10 is situated between the step pair of holder 30' having a size, that is a distance between the corresponding steps thereof, appropriate to that particular crystal. For example, crystal 10 is shown situated between step pair 32c-34c. Electrode 14 is attached to support structure 32 by an electrically conductive media such as electrically conductive Epoxy ™ (not shown) which is readily commercially available. Similarly, electrically conductive Epoxy ™ is conveniently employed to connect electrode 12 to support structure 34. Thus, electrode 14 is electrically connected to mounting pad 44 via an electrical path through structure 32 and electrode 12 is electrically connected to mounting pad 46 via an electrically conductive path through structure 34, the two paths being electrically isolated from each other by insulator 37.

A crystal holder 30" shown in FIG. 2C is formed by individually fabricating crystal support structures 32 and 34. Crystal holder 30" is structurally identical to holder 30' of FIG. 2B except for the modification that holder 30" includes no central connecting element 36. Support structures 32 and 34 are conveniently fabricated by extrusion or molding techniques, for example, in a manner similar to that discussed above. Support structures 32 and 34 are individually attached to appropriate bonding pads 44 and 46, respectively, on substrate 42. Crystal 10 may then be situated between the vertical portions of the appropriate step pair of crystal holder 30".

FIG. 3A shows crystal holder 50, the preferred embodiment of the invention. Crystal holder 50 is identical to crystal holder 30 shown in FIG. 2A as discussed above except for the following modifications. (Like numbers are used to designate like components in FIG. 3A which are similar to those in the earlier drawings already discussed.) Crystal holder 50 includes a main body 60 which is identical to holder 30 except that main body 60 is comprised of an electrically insulative material such as plastic, for example. A layer of electrically conductive material 62 is situated covering stair steps 32a-32d and sufficient portions of the external surfaces of support structure 32 to create an electrically conductive path between stair steps 32a-32d and mounting foot 38 therebelow as shown in FIG. 3A, for example. A layer of electrically conductive material 64 is situated on stair steps 34a-34d and sufficient portions of the remaining external surfaces of support structure 34 to create an electrically conductive path between stair steps 34a and 34d and mounting foot 40 therebelow. Central connecting element 36 is not coated with electrically conductive material and thus conductive layer 62 is electrically insulated from conductive layer 64. Electrically conductive layers 62 and 64 are readily fabricated on the above-described surfaces of crystal holder 50 by masking those external surfaces of holder 50 where such an electrically conductive layer is not desired, such as center connecting structure 36. The remaining portions of main body 60 are then dipped in, sprayed, solder-coated or otherwise coated with an appropriate electrically conductive material.

Layers 62 and 64 are conveniently comprised of nickel having a thickness of 11,000 angstroms, for example, coated with a flash of gold or silver having a thickness of 500 angstroms to prevent layers 62 and 64 from oxidizing. Thus, quality electrical connections between crystal 10 and crystal holder 50, and between substrate mounting pads 44 and 46 and crystal holder 50 are assured. The dimensions given above for layers 62 and 64 are given only by way of example. It should be understood that greater or lesser thicknesses may be employed providing the thicknesses of the layers are not so small as to result in poor electrical conductivity or so thick as to be prohibitively expensive or mechanically restrictive.

Crystal holder 50 is mounted on substrate 42 in the same manner as described above in the description of FIG. 2. Likewise, crystal 10 is connected to crystal holder 50 in the same manner as described in the discussion of FIG. 2. Since crystal holder 50 is comprised substantially of an electrically insulative material, there is no need to cut holder 50 at center connecting structure 36 as was suggested with crystal holder 30' of FIG. 2B as one way to achieve electrical isolation between crystal support structures 32 and 34. Such a cutting (that is, sawing) step is desirably avoided due to the possibility of creating debris which may contaminate the crystal holder. Such debris would have to be cleaned therefrom at the expense of additional time and effort. This sawing procedure is thus advantageously avoided by employing crystal holder 50.

Main body 60 of crystal holder 50 is conveniently fabricated of plastic by molding techniques well known to those skilled in the art. Well known extrusion processes may also be used to fabricate main body 60.

FIG. 3B shows a perspective view of crystal holder 50.

A crystal holder 50' shown in FIG. 3C is formed by individually fabricating crystal support structures 32 and 34 from an electrically insulative material. Crystal holder 50' is substantially similar to holder 50 of FIG. 3D except for the modification that holder 50' includes no central connecting element 36. Support structures 32 and 34 are fabricated by extrusion or molding processes, for example, and then coated with layers of electrically conductive material, 62' and 64', respectively. More specifically, layer 62' covers a sufficient portion of the external surfaces of support structure 32 to form an electrically conductive path between steps 32a–32d and foot structure 38. Likewise, layer 64' covers a sufficient portion of the external surfaces of support structure 34 to form an electrically conductive path between steps 34a–34d and foot structure 40. Support structures 32 and 34 of holder 50' are individually attached to appropriate bonding pads 44 and 46, respectively, on substrate 42. Crystal 10 may then be situated between the vertical portions of the appropriate step pair of crystal holder 50'.

The foregoing describes a piezoelectric crystal holder capable of accepting crystals having various sizes and configurations, both circular and rectangular, for example. The crystal holder is advantageously easily positioned and mounted on a selected substrate by automated machinery.

While only certain preferred features of the invention have been shown by way of illustration, many modifications and changes will occur to those skilled in the art. It is, therefore, to be understood that the present claims are intended to cover all such modifications and changes as fall within the true spirit of the invention.

We claim:

1. A crystal holder for supporting a piezoelectric crystal comprising:

first and second opposed side portions of selected material, each of said portions having electrically conductive top and bottom surfaces and having at least sufficient electrically conductive external surfaces to provide electrically conductive paths from the respective top surfaces of said first and second side portions to the respective bottom surfaces thereof, the electrically conductive paths of said first side portion being electrically insulated from the electrically conductive paths of said second side portion, said first side portion including a plurality of steps in the top surface thereof leading upwardly and away from said second side portion in stair step-like fashion, each step having a horizontal portion and a vertical portion, the horizontal portion of each step being situated at a different selected height above the bottom surface of said first side portion, said second side portion including a plurality of steps in the top surface thereof, each step having a horizontal portion and a vertical portion, the steps of said second portion leading upwardly and away from said first side portion in stair step-like fashion and in a direction opposite to that which the steps of said first side portion lead as viewed from above said first and second side portions, the horizontal portion of each step of said second side portion being horizontally aligned with a corresponding horizontal portion of a step of said first side portion, each step of said first side portion and the corresponding horizontally aligned step of said second side portion having a horizontal distance therebetween sufficient to accommodate a crystal of predetermined horizontal dimension between the respective vertical portions of such corresponding steps.

2. The crystal holder of claim 1 wherein said selected material comprises an electrically conductive material.

3. The crystal holder of claim 1 wherein said holder is comprised of an electrically insulative material except for said top and bottom surfaces and said electrically conductive external surfaces.

4. The crystal holder of claim 1 including a center portion connecting said first and second side portions.

5. The crystal holder of claim 2 including a center portion comprised of electrically insulative material situated connecting said first and second side portions.

6. The crystal holder of claim 3 including a center portion comprised of electrically insulative material situated connecting said first and second side portions.

7. The crystal holder of claims 3, 5, or 6 wherein said electrically insulative material comprises plastic.

* * * * *